(12) United States Patent
Zhang et al.

(10) Patent No.: US 12,453,211 B2
(45) Date of Patent: Oct. 21, 2025

(54) SEMICONDUCTOR STRUCTURES

(71) Applicant: ENKRIS SEMICONDUCTOR, INC., Jiangsu (CN)

(72) Inventors: Liyang Zhang, Jiangsu (CN); Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 427 days.

(21) Appl. No.: 18/319,460

(22) Filed: May 17, 2023

(65) Prior Publication Data
US 2024/0145626 A1    May 2, 2024

(30) Foreign Application Priority Data
Nov. 1, 2022    (CN) .......................... 202211358853.3

(51) Int. Cl.
*H10H 20/815*    (2025.01)
*H10H 20/01*    (2025.01)
(Continued)

(52) U.S. Cl.
CPC ...... *H10H 20/815* (2025.01); *H10H 20/0133* (2025.01); *H10H 20/812* (2025.01);
(Continued)

(58) Field of Classification Search
None
See application file for complete search history.

(56) References Cited

U.S. PATENT DOCUMENTS

| | | | |
|---|---|---|---|
| 10,217,900 B2* | 2/2019 | Nayak | H10H 20/812 |
| 2003/0020089 A1* | 1/2003 | Yu | H10D 84/08 |
| | | | 257/E21.12 |

(Continued)

FOREIGN PATENT DOCUMENTS

| | | |
|---|---|---|
| CN | 1203463 C | 5/2005 |
| CN | 1719582 A | 1/2006 |

(Continued)

OTHER PUBLICATIONS

"MCLED Era 25 COG Glass Substrate Micro LED Display"Sep. 18, 2021 pp. 7.

*Primary Examiner* — Bilkis Jahan
(74) *Attorney, Agent, or Firm* — The Small Patent Law Group LLC; Christopher R. Carroll

(57) ABSTRACT

The present application discloses a semiconductor structure including: a base, the base being made of an amorphous material and including at least one trench; a monocrystalline layer, at least part of the monocrystalline layer being provided in the trench; and an epitaxial structure layer, located on the side of the monocrystalline layer away from the base. The semiconductor structure disclosed in the present application includes the monocrystalline layer formed in the at least one trench of the base, and an amorphous material with a thermal expansion coefficient similar to that of the monocrystalline layer is selected as the base, which can relieve the tensile stress generated by the monocrystalline layer during the epitaxial process. At the same time, the epitaxial structure layer is grown on an independent monocrystalline layer, and the size is small, which alleviates the problem of semiconductor film cracking on the large-size substrate.

17 Claims, 7 Drawing Sheets

(51) Int. Cl.
*H10H 20/812* (2025.01)
*H10H 20/819* (2025.01)
*H10H 20/824* (2025.01)
*H10H 20/831* (2025.01)
*H10H 29/14* (2025.01)

(52) U.S. Cl.
CPC ........ *H10H 20/819* (2025.01); *H10H 20/824* (2025.01); *H10H 20/8312* (2025.01); *H10H 29/142* (2025.01)

(56) References Cited

U.S. PATENT DOCUMENTS

| | | | | |
|---|---|---|---|---|
| 2003/0022525 A1* | 1/2003 | Droopad | ................ | C30B 23/02 |
| | | | | 257/E27.012 |
| 2014/0220766 A1* | 8/2014 | Cheng | ................... | H10D 62/82 |
| | | | | 438/471 |

FOREIGN PATENT DOCUMENTS

| | | | |
|---|---|---|---|
| CN | 108878265 A | 11/2018 | |
| CN | 108878266 A | 11/2018 | |
| CN | 110301047 A | 10/2019 | |

* cited by examiner

SEMICONDUCTOR STRUCTURES

CROSS REFERENCE TO RELATED APPLICATIONS

This application claims priority to Chinese Patent Application No. 2022113588533 filed on Nov. 1, 2022, the entire content of which is incorporated herein by reference.

TECHNICAL FIELD

The present disclosure relates to the technical field of semiconductors and in particular, to semiconductor structures.

BACKGROUND

In the semiconductor field, commonly-used substrates for semiconductor devices include silicon substrates, silicon carbide substrates, sapphire substrates, etc. Compared to silicon carbide substrates and sapphire substrates, silicon substrates have the advantages of better thermal conductivity, better electrical conductivity, and can be made into large sizes. For example, when a silicon substrate is applied to a GaN (gallium nitride) based semiconductor device, thermal mismatch and lattice mismatch between the silicon substrates and the GaN based material lead to cracking of GaN based semiconductor film, making high performance semiconductor devices difficult to be manufactured, which is very common in large size silicon substrates. Therefore, there is a need to provide a method that is simple to control and can manufacture small-sized silicon substrates.

SUMMARY

In view of this, the present disclosure provides a semiconductor structure.

An aspect of the present application provides a semiconductor structure including: a base, where the base includes an amorphous material, and the base includes at least one trench; a monocrystalline layer, where at least part of the monocrystalline layer is in the at least one trench; and an epitaxial structure layer, located on a side of the monocrystalline layer away from the base.

In some examples, a cross-section of the at least one trench includes rectangular, triangular or hexagonal, and the cross-section is along a plane parallel to a plane in which the base is located.

In some examples, in a wavelength range from 360 nm to 800 nm, a light transmittance of at least one wavelength of light passing through the base is greater than 70%.

In some examples, a material of the base includes glass or organic polymer material.

In some examples, the monocrystalline layer includes monocrystalline Si or monocrystalline Ge.

In some examples, a crystal face of the monocrystalline layer away from the base includes a (111) crystal face.

In some examples, the monocrystalline layer includes monocrystalline Si, and a thickness of the monocrystalline layer is less than or equal to 1 μm.

In some examples, the monocrystalline layer includes monocrystalline Si, and the epitaxial structure layer includes a GaN-based material.

In some examples, the monocrystalline layer includes monocrystalline Ge, and the epitaxial structure layer includes a GaAs layer.

In some examples, the epitaxial structure layer further includes an AlInGaP layer located on a side of the GaAs layer away from the monocrystalline layer.

In some examples, the at least one trench includes a plurality of trenches, and the plurality of the trenches are arranged in an array or in a staggered arrangement.

In some examples, a part of the monocrystalline layer protrudes from the at least one trench.

In some examples, the at least one trench includes a plurality of groups, each group includes multiple trenches, an area of a cross-section of at least one of the trenches in a group is different from areas of cross-sections of the other trenches in the group, and the cross-section is along a plane parallel to a plane in which the base is located.

In some examples, one of the at least one trench includes an open end and a bottom wall opposite to each other in a direction of a thickness of the base; and an orthographic projection of the open end on a plane in which the base is located and an orthographic projection of the bottom wall on a plane in which the base is located are at least partially staggered.

In some examples, the epitaxial structure layer further includes: a first semiconductor layer, an active layer and a second semiconductor layer that are sequentially stacked, where the active layer is on a side of the first semiconductor layer away from the base; and a conductivity type of the second semiconductor layer is opposite to a conductivity type of the first semiconductor layer.

In some examples, the semiconductor structure further includes: a first electrode, penetrating the monocrystalline layer, where the first electrode is electrically connected to the first semiconductor layer; and a second electrode, penetrating the active layer, the first semiconductor layer and the monocrystalline layer, where the second electrode is electrically connected to the second semiconductor layer.

In some examples, the semiconductor structure further includes: a drive circuit, located on a side of the monocrystalline layer away from the first semiconductor layer, where the drive circuit is electrically connected to the first electrode or the second electrode; and an orthographic projection of the drive circuit on the plane in which the base is located is staggered from an orthographic projection of the at least one trench on the plane in which the base is located.

DETAILED DESCRIPTION

Exemplary embodiments will be described in detail herein, examples of which are illustrated in the accompanying drawings. When the following description refers to the drawings, the same numerals in different drawings refer to the same or similar elements unless otherwise indicated. Embodiments described in the illustrative examples below are not intended to represent all embodiments consistent with the present disclosure. Rather, they are merely embodiments of devices and methods consistent with some aspects of the present disclosure as recited in the appended claims.

Figure 1:
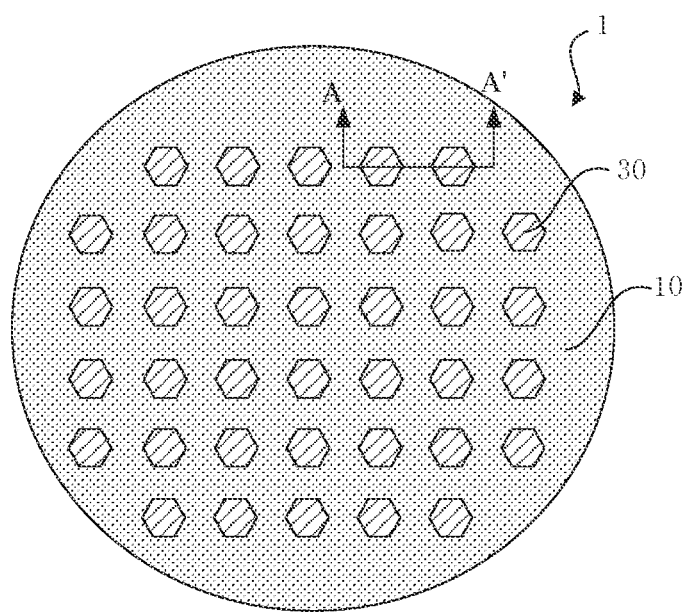
FIG. 1 is a schematic diagram of a semiconductor structure according to an embodiment of the present disclosure.
Figure 2:
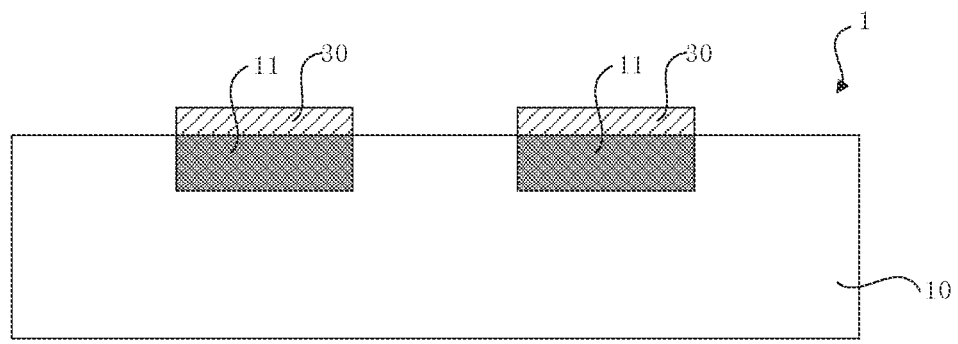
FIG. 2 is a cross-sectional view of the semiconductor structure shown in FIG. 1 along A-A'.
Figure 3:
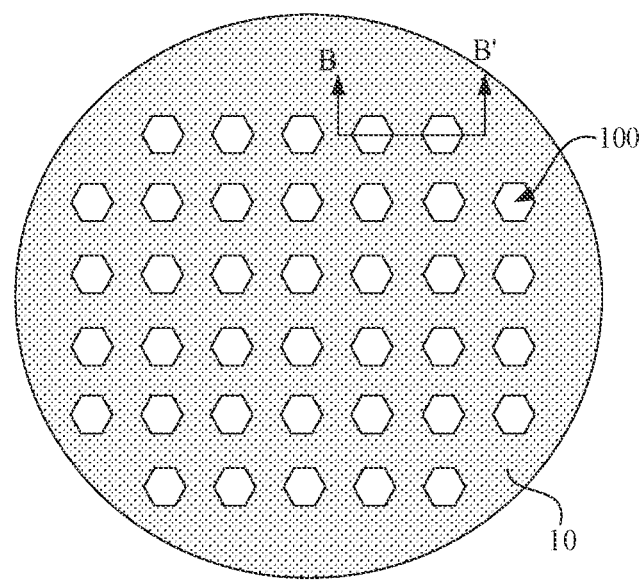
FIG. 3 is a schematic structure diagram of a base according to an embodiment of the present disclosure.

FIG. 1 is a schematic diagram of a semiconductor structure according to an embodiment of the present disclosure, FIG. 2 is a cross-sectional view of the semiconductor structure shown in FIG. 1 along A-A', and FIG. 3 is a schematic structure diagram of a base according to an embodiment of the present disclosure. As shown in FIGS. 1 to 3, the present disclosure provides a semiconductor structure including: a base 10, where the base 10 is made of an amorphous material, and includes at least one trench 100; a monocrystalline layer 11, where at least portion of the monocrystalline layer 11 is in the trench 100; and an epitaxial structure layer 30, located on a side of the monocrystalline layer 11 away from the base 10.

It should be noted that, as shown in FIG. 2, the base 10 serves as a substrate for the semiconductor structure, the at least one trench 100 is configured to set the monocrystalline layer 11, and the epitaxial structure layer 30 is formed on the monocrystalline layer 11, and in this way, unit structures of the epitaxial structure layer 30 are formed. Optionally, one epitaxial structure layer 30 corresponds to one monocrystalline layer 11.

The base 10 is made of an amorphous material, such as an inorganic glass composed of silica ($SiO_2$) or a mixture of silica and oxides of elements such as Al, Na, Mg, Ca, etc. In addition, a glassy state of a mixture of some V, VI and VII group elements, such as a sulfur-based glass, can also be used as the base 10. Compared to Si substrates, the above amorphous materials are relatively simple to manufacture and have relatively low cost. Therefore, choosing an amorphous material with a thermal expansion coefficient close to that of the monocrystalline layer 11 as the base 10 can relieve the tension stress generated by monocrystalline layer 11 during the epitaxy process, and then the monocrystalline layer 11 as well as the epitaxial structure layer 30 are grown on the at least one trench 100 of the base 10, which can significantly reduce the cost and the manufacturing cycle, make it easier to obtain a semiconductor structure with smaller size, easier to miniaturization, simplification and high integration, and alleviate the problem of semiconductor film cracking on large size substrates.

Figure 4:
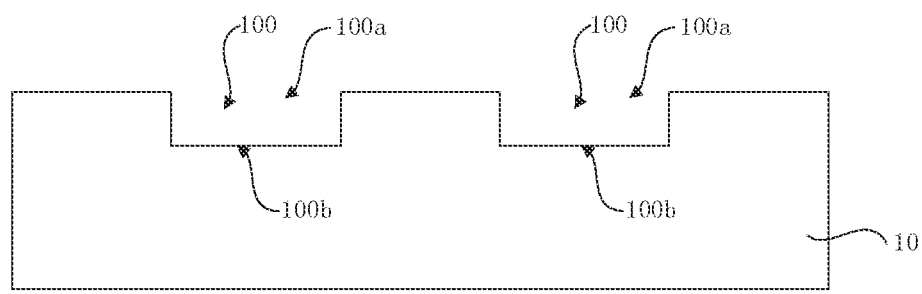
FIGS. 4 to 7 are schematic diagrams of a process for manufacturing a semiconductor structure according to an embodiment of the present disclosure.
Figure 5:
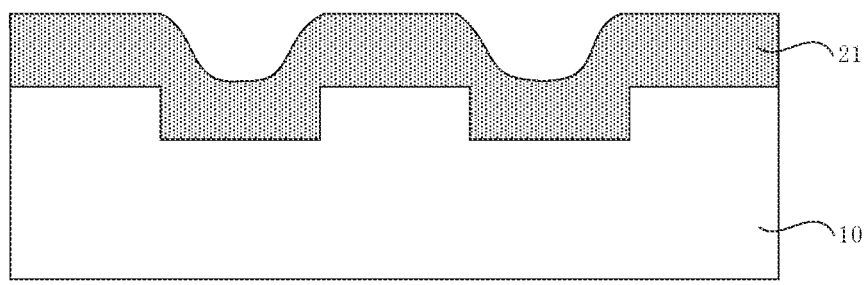
Figure 6:
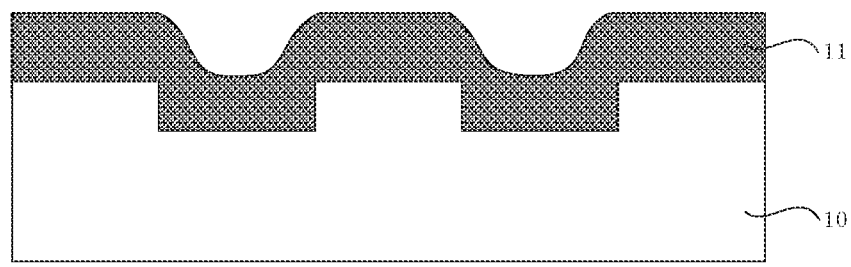
Figure 7:
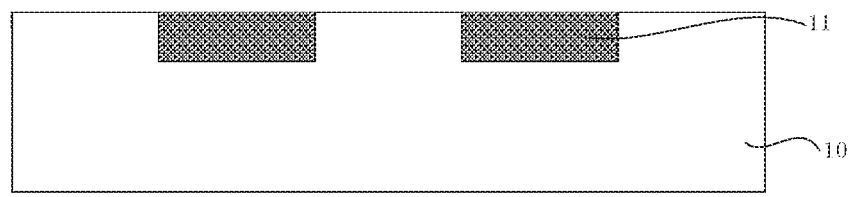

As shown in FIGS. 4 to 7, FIGS. 4 to 7 are schematic diagrams of a process for manufacturing a semiconductor structure according to an embodiment of the present disclosure, where the monocrystalline layer 11 is a monocrystalline material. The manufacturing process of the monocrystalline material is simple, for example, the monocrystalline layer 11 is monocrystalline Si. As shown in FIG. 4, at least one trench 100 is formed in the base 10. As shown in FIG. 5, a monocrystalline formation layer 21 is manufactured on the entire side of the base 10 in which the at least one trench 100 is located, such that the monocrystalline formation layer 21 is at least partially located in the at least one trench 100. The process for manufacturing the monocrystalline formation layer 21 can be physical vapor deposition or chemical vapor deposition, etc. The monocrystalline formation layer 21 can be amorphous Si or polycrystalline Si. As shown in FIG. 6, the monocrystalline formation layer 21 is annealed by lasers to transform the monocrystalline formation layer 21 into a monocrystalline layer 11, where the monocrystalline layer 11 is monocrystalline Si. Optionally, only the monocrystalline formation layer 21 within the at least one trench 100 is annealed by lasers. As shown in FIG. 7, the monocrystalline layer 11 outside the at least one trench 100 is removed by chemical mechanical polishing (CMP), such that at least portion of the monocrystalline layer 11 is set within the at least one trench 100.

Optionally, as shown in FIG. 4, at least one trench 100 is formed in the base 10, where each trench 100 includes an open end 100a and a bottom wall 100b. In some embodiments, a mask layer is formed on the base 10, and the mask layer is patterned, such that the mask layer is used to form one or more trenches 100 to expose the base 10, and then the mask layer is subsequently removed. The mask layer may be patterned by steps such as etching, etc. In other embodiments, the base 10 can also be patterned directly to form the at least one trench 100. The at least one trench 100 has a depth of 1 to 100 μm and a width of 1 to 50 μm.

Optionally, the monocrystalline formation layer 21 is annealed by lasers to form the monocrystalline layer 11, compared to conventional high temperature annealing, laser annealing has the advantage of rapid temperature rise and localized treatment for the at least one trench. Laser annealing can be performed by supplying a gas for growing the epitaxial structure layer 30, e.g., nitrogen, argon or oxygen, etc. Laser annealing for the monocrystalline formation layer 21 can improve the structure inside the monocrystalline formation layer to obtain a monocrystalline structure. For example, in the case where the monocrystalline formation layer 21 is amorphous Si, monocrystalline Si can be obtained after laser annealing. The laser temperature used for laser annealing can be 500-1400° C. and the laser energy density can be 400-3000 mJ/cm$^2$. Laser annealing can be performed on the monocrystalline formation layer by excimer laser annealing.

Figure 8:
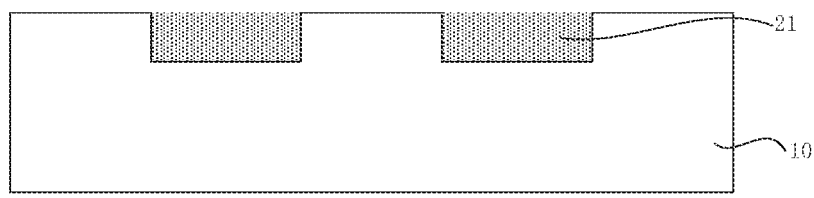
FIG. 8 is a schematic diagram of an intermediate structure for manufacturing a semiconductor structure according to an embodiment of the present disclosure.

Optionally, as shown in FIG. 4, FIG. 5, FIG. 8 and FIG. 7, FIG. 8 is a schematic diagram of an intermediate structure for manufacturing a semiconductor structure according to an embodiment of the present disclosure. As shown in FIG. 5 and FIG. 8, after depositing the monocrystalline formation layer 21 on the whole surface, the monocrystalline formation layer 21 outside the at least one trench 100 is removed by CMP, such that the monocrystalline formation layer 21 is set inside the at least one trench 100; as shown in FIG. 7, the monocrystalline formation layer 21 inside the at least one trench 100 is then annealed by lasers to transform the monocrystalline formation layer 21 into a monocrystalline layer 11. By using the method of polishing and then laser annealing, the obtained monocrystalline crystal of the monocrystalline layer 11 has higher quality.

Optionally, the monocrystalline formation layer 21 can be formed only within the at least one trench 100 by using, for example, photoresist blocking.

In some embodiments, a cross-section of the at least one trench 100 may be rectangular, triangular, or hexagonal, where the cross-section is along a plane parallel to the plane in which the base 10 is located. Specifically, as shown in FIGS. 1 and 3, the cross-section of the at least one trench 100 is hexagonal. The cross-section of the at least one trench 100 may also be other shapes such as a circle, which is not limited in the present disclosure.

In the corresponding manufacturing method of the semiconductor structure, optionally, the amorphous layer 21 is amorphous silicon or polycrystalline silicon, and when the cross-section of the trench 100 is rectangular, the amorphous layer 21 is first annealed by lasers to form a monocrystalline layer 11, and then the monocrystalline layer 11 is treated with an alkaline solution to form a monocrystalline layer with a (111) crystal face, and the monocrystalline layer 11 is monocrystalline silicon. It should be noted that when the cross-section of the trench 100 is rectangular, the monocrystalline layer 11 formed after laser annealing has a monocrystalline silicon (100) crystal face, and the monocrystalline layer 11 is subsequently treated with an alkaline solution to form a (111) crystal face. Due to the anisotropy of monocrystalline silicon, the etching rate of the monocrystalline silicon in alkaline solutions varies in different crystal orientations. For example, a KOH solution can be used to etch the monocrystalline silicon to produce an anisotropic V-shaped etch to obtain the (111) crystal face. The (111) crystal face is more conducive to the epitaxial growth of epitaxial structure layers (e.g., epitaxial structure layers of III-V compound materials).

Optionally, the amorphous layer 21 is amorphous silicon or polysilicon, and when the cross-section of the trench 100 is triangular or hexagonal, laser annealing for the amorphous layer 21 is sufficient to form the monocrystalline layer 11 with the (111) crystal face. The monocrystalline layer 11 is monocrystalline silicon and does not need to be treated with alkaline solution again, which saves the process.

In some embodiments, in the wavelength range of 360 nm to 800 nm, the light transmittance of at least one wavelength of light passing through the base 10 is greater than 70%.

The light within the wavelength range from 360 nm to 800 nm includes visible light, and the material used for base 10 may allow visible light transmission. Optionally, in the wavelength range of 360 nm to 800 nm, at least 30% of the light in the wavelength range has a light transmittance greater than 70% when passing through the base 10.

Optionally, the base 10 may be made of glass, such as inorganic glass or sulfur-based glass material, or organic polymer material, etc. The organic polymer material may be a transparent, high melting point material. Optionally, the glass is a high melting point glass (with a melting point higher than 700° C.) to meet the manufacturing environment for growing the monocrystalline layer and an epitaxial process. On the one hand, the manufacturing cost of glass is low and the production process is relatively simple. Using the glass material as the base and growing the monocrystalline layer and the epitaxial structure layer on the base can reduce the production cost as well as the production cycle; on the other hand, it can be driven based on thin film transistor to realize Micro-LED display, and also can realize transparent display panel with more attractive visual effect.

In some embodiments, the monocrystalline layer 11 includes monocrystalline Si or monocrystalline Ge. Specifically, monocrystalline Si can be used as an epitaxial substrate for III-V semiconductor materials, such as GaN-based semiconductor materials, and the epitaxial structure layer 30 includes GaN-based materials. Glass and monocrystalline Si have similar thermal expansion coefficients, which can realize a good choice of base 10; monocrystalline Ge can be used as an epitaxial substrate for III-V semiconductor materials, such as GaAs-based semiconductor materials, and the epitaxial structure layer 30 includes GaAs layer.

Optionally, when the monocrystalline layer 11 is monocrystalline Ge, the epitaxial structure layer 30 also includes an AlInGaP layer located on the side of the GaAs layer away from the monocrystalline layer 11, and the epitaxial structure layer 30 can be used to make a light-emitting structure, with the AlInGaP layer and the InGaP material layer forming the light-emitting layer of the light-emitting structure, and the GaAs layer serves as an epitaxial substrate for the AlInGaP layer.

In some embodiments, the crystal face of the monocrystalline layer 11 away from the base 10 is a (111) crystal face. Specifically, the (111) crystal face is more conducive to the epitaxial growth of epitaxial structure layers (e.g., epitaxial structure layers of III-V compound materials).

In some embodiments, the monocrystalline layer 11 is monocrystalline Si, and the thickness of the monocrystalline layer 11 is less than or equal to 1 µm. The monocrystalline layer 11 is monocrystalline Si, and the thickness of the monocrystalline layer 11 is less than or equal to 1 µm, and therefore a transparent monocrystalline layer can be obtained to realize a double-sided display. Together with the transparent base, a transparent display unit can be further realized, which can be applied to devices such as Augmented Reality glasses, etc.

Figure 9:
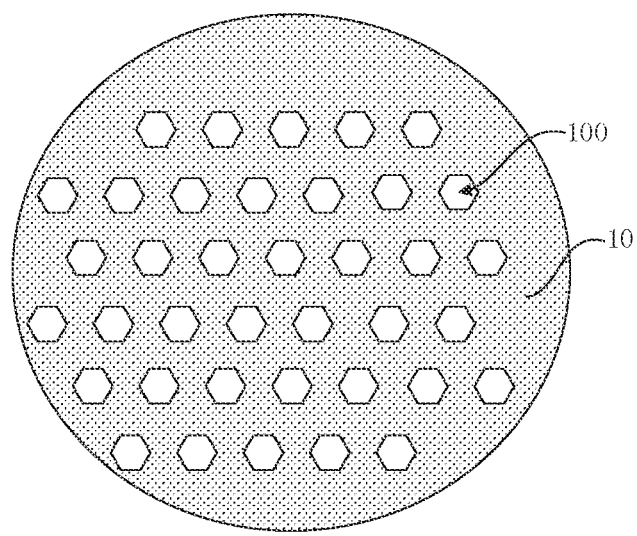
FIG. 9 is a schematic structure diagram of a base according to an embodiment of the present disclosure.
Figure 10:
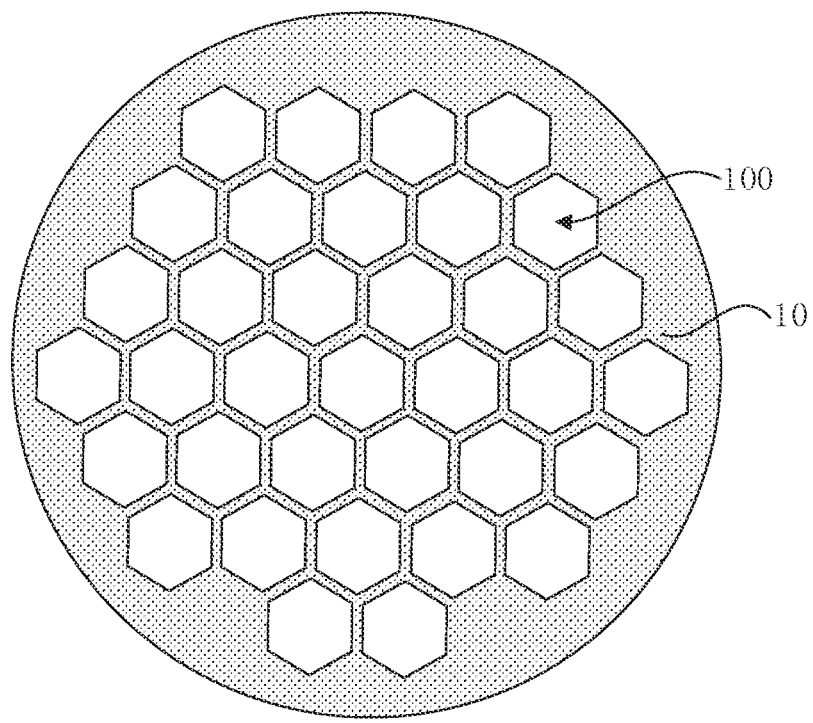
FIG. 10 is a schematic structure diagram of a base according to an embodiment of the present disclosure.

In some embodiments, there is a plurality of trenches 100, and the plurality of trenches 100 are arranged in an array or staggered arrangement. Specifically, as shown in FIG. 3, the trenches in FIG. 3 are arranged in an array, and the angle between the direction of horizontal arrangement and the direction of longitudinal arrangement is a right angle. As shown in FIG. 9 and FIG. 10, FIG. 9 is a schematic structure diagram of a base according to an embodiment of the present disclosure, FIG. 10 is a schematic structure diagram of a base according to an embodiment of the present disclosure, the trenches in FIG. 9 and FIG. 10 are arranged in a staggered arrangement, and an angle between the direction of the horizontal arrangement and the direction of the longitudinal arrangement is obtuse or acute. It should be noted that the longitudinal direction here is not a direction perpendicular to the horizontal direction. In some embodiments, as shown in FIG. 10, the trenches 100 may be hexagonal trenches and arranged in a close hexagonal arrangement. Optionally, the staggered arrangement includes at least one of the following: a diamond arrangement, a hexagonal arrangement, or a triangular arrangement. It is noted that FIGS. 9 and 10 illustrate only part of the trenches 100 in the base 10.

Figure 11:
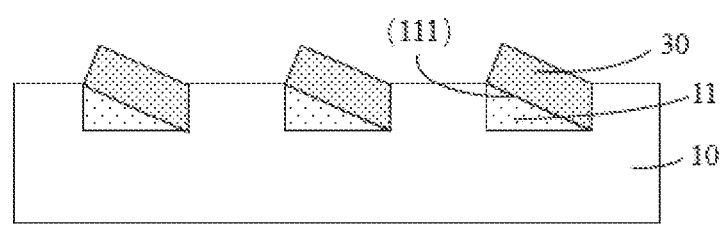
FIG. 11 is a schematic diagram of a semiconductor structure according to an embodiment of the present disclosure.

It is noted that, as shown in FIG. 2, an upper surface of the monocrystalline layer 11 is a (111) crystal face. The upper surface is drawn as a plane only for illustrative purposes and does not limit the upper surface of the (111) crystal face of the monocrystalline layer 11 to be parallel to the plane in which the base 10 is located. As shown in FIG. 11, FIG. 11 is a schematic diagram of a semiconductor structure according to an embodiment of the present disclosure, in the embodiment where the trenches are rectangular, after treating the (100) crystal face with an alkaline solution, the upper surface of the monocrystalline layer 11 is not parallel to the base 10, and the upper surface of the monocrystalline layer 11 is the (111) crystal face, and subsequently the epitaxial structure layer 30 is manufactured on the (111) crystal face of the monocrystalline layer 11, and the epitaxial growth direction is perpendicular to the (111) crystal face.

Figure 12:
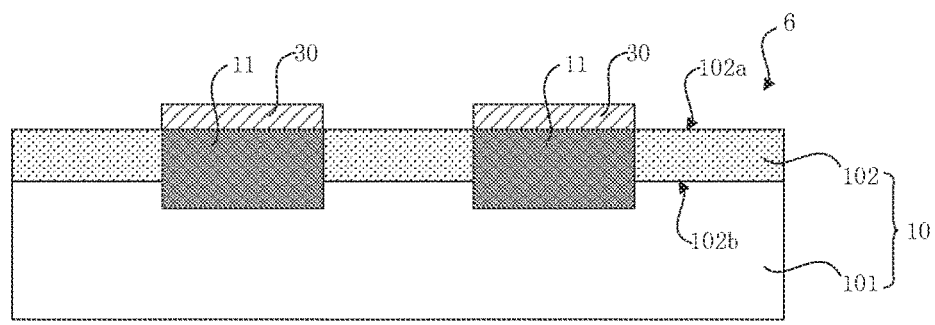
FIG. 12 is a schematic diagram of a semiconductor structure according to an embodiment of the present disclosure.
Figure 13:
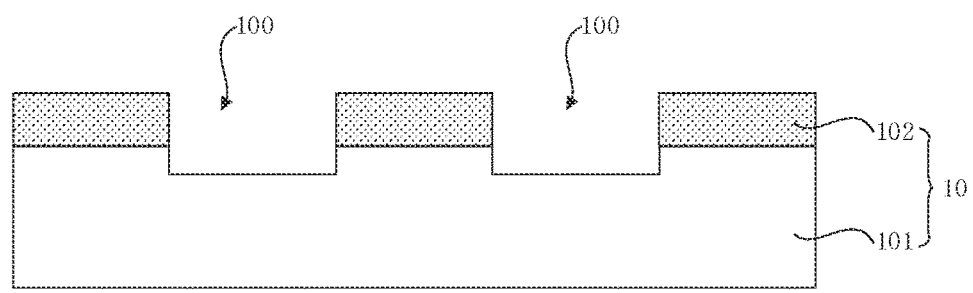
FIG. 13 is a schematic structure diagram of a base according to an embodiment of the present disclosure.
Figure 14:
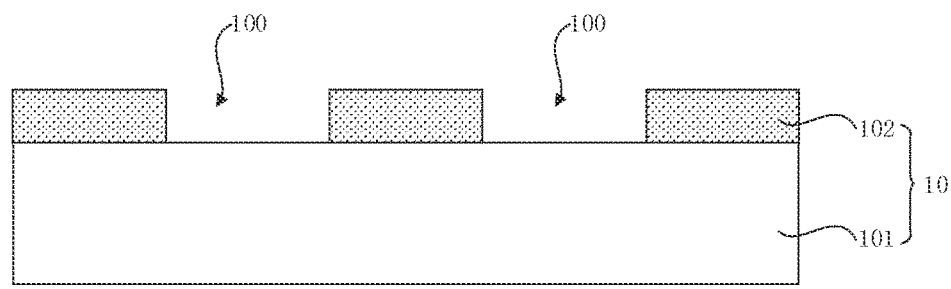
FIG. 14 is a schematic structure diagram of a base according to an embodiment of the present disclosure.

FIG. 12 is a schematic diagram of a semiconductor structure according to an embodiment of the present disclosure, FIG. 13 is a schematic structure diagram of a base according to an embodiment of the present disclosure, and FIG. 14 is a schematic structure diagram of a base according to an embodiment of the present disclosure. In some embodiments, as shown in FIGS. 2 and 4, the base 10 includes a single-layer structure and the trench 100 is formed within the single-layer structure. In an example, the base 10 is glass; or, as shown in FIGS. 12 to 14, the base 10 includes a multi-layer structure and the trench 100 is opened from the upper surface of the base 10 and formed within the multi-layer structure.

Specifically, as shown in FIGS. 12 to 14, the base 10 is a multilayer structure, and the base 10 may include a first base layer 101 and a second base layer 102, where the second base layer 102 is on the first base layer 101, and the trench 100 is opened on the upper surface of the base 10 and formed within the multilayer structure of the base. In FIGS. 12 and 13, the trench 100 penetrates the second base layer 102 and a part of the first base layer 101; in FIG. 14, the trench 100 only penetrates the second base layer 102. A depth of the trench 100 in this embodiment may be set based on the thickness of the monocrystalline layer 11 that realizes a transparent display.

In some embodiments, as shown in FIG. 14, the first base layer 101 and the second base layer 102 may have different etching rates, for example, the etching rate of the first base layer 101 may be less than the etching rate of the second base layer 102, whereby the first base layer 101 may be used as an etching stop layer when etching the trench, and only the second base layer 102 is etched to obtain the trench 100, thus the process of etching the trench is simplified. Optionally, the semiconductor device is configured to make a light-emitting device, and the second base layer 102 is selected from a material with low light transmission, so that the light-emitting device emits light only from the trench 100, improving the problem of mutual interference of lights from the light-emitting device.

Figure 15:
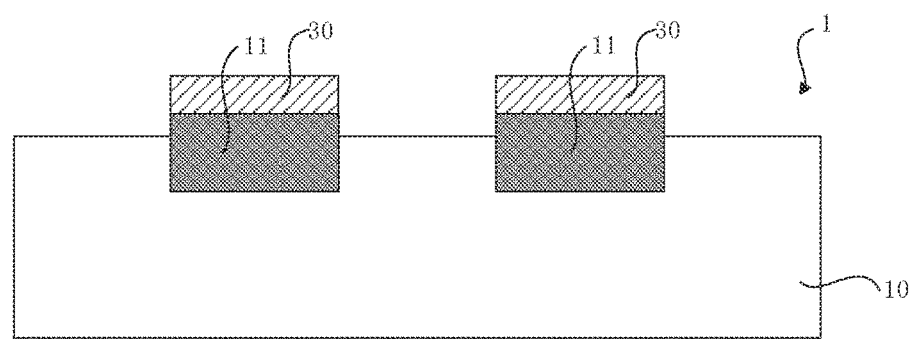
FIG. 15 is a schematic diagram of a semiconductor structure according to an embodiment of the present disclosure.

In some embodiments, FIG. 15 is a schematic diagram of a semiconductor structure according to an embodiment of the present disclosure, as shown in FIG. 15, a part of the monocrystalline layer 11 protrudes from the trench 100.

Specifically, as shown in FIGS. 2 and 12, the trench 100 is provided in the upper surface of the base 10, the monocrystalline layer 11 is provided within the trench 100, and the upper surface of the monocrystalline layer 11 is flush with the upper surface of the base 10. Different from FIGS. 2 and 12, in FIG. 15, the monocrystalline layer 11 may also protrude from the trench on the upper surface of the base 10. Optionally, after growing the monocrystalline layer 11 on the base 10 having the trench 100, a part of the monocrystalline layer on the base 10 is removed by the CMP technique (i.e., the monocrystalline layer deposited on the upper surface of the base 10 is polished by the CMP technique, but not polished to the upper surface of the base 10), and then the monocrystalline layer deposited on the upper surface of the base 10 outside the trench is etched away to form an independent unit of the monocrystalline layer 11 protruding from the trench 100.

Figure 16:
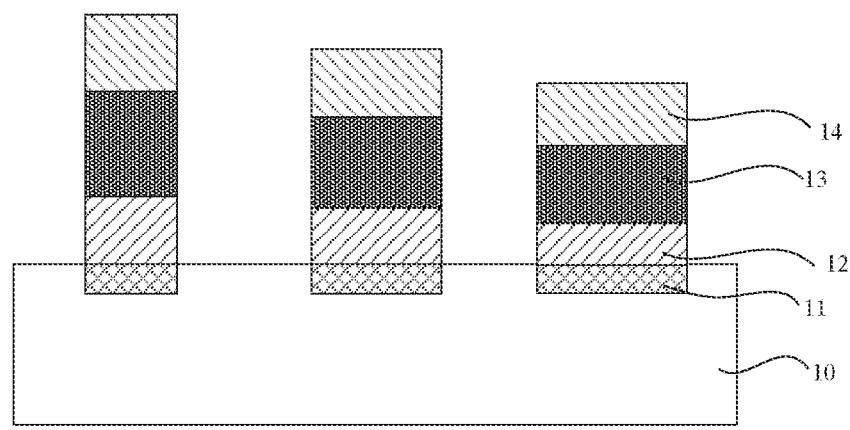
FIG. 16 is a schematic diagram of a semiconductor structure according to an embodiment of the present disclosure.

In some embodiments, trenches 100 belong to a number of groups, each group of trenches 100 having a plurality of trenches. In a group of trenches, at least one trench 100 has a cross-sectional area different from the cross-sectional areas of the other trenches 100, where the cross-section is along a plane parallel to the plane in which the base 10 is located. Specifically, FIG. 16 is a schematic diagram of a semiconductor structure according to an embodiment of the present disclosure. FIG. 16 illustrates only one group of trenches 100, including three trenches 100 with different cross-sectional areas, and the trenches 100 are filled with monocrystalline layers 11.

It should be noted that active layers 13 grown on the monocrystalline layers 11 with different cross-sectional areas has different contents of luminescent component, and can emit light of different colors, including visible light from blue to green to red. Therefore, by providing a plurality of trenches with different cross-sectional areas in a group of trenches, it is possible to realize light emission corresponding to a plurality of colors through a group of trenches.

Specifically, a material of the active layer 13 may include a GaN-based material, which can be doped with Indium (In) elements, for example, the material of the active layer 13 may include InGaN. The greater the doping amount of In, the longer the light-emitting wavelength of the active layer 13; a material of the active layer 13 may also be doped with Al elements, for example, the material of the active layer 13 may include AlGaN, the greater the doping amount of Al, the shorter the light-emitting wavelength of the active layer 13. The areas of the cross-sections of the trenches 100 are different, so when growing the active layer 13, a flow rate of the reaction gas for each monocrystalline layer 11 is different, and thus the doping rate of In or Al element and the doping rate of Ga element is different, that is, the doping efficiency of In or Al element is different, which makes the component ratio of In or Al element in the grown active layer 13 different. Specifically, the smaller the area of the cross-section of the trench 100, the faster the growth rate of the base material GaN of the active layer 13, the better the selectivity of the doping of In element, and the greater the doping rate of the In element is than the doping rate of the Ga element, so that the smaller the area of the cross-section of the trench 100, the higher the component content of In elements in the InGaN material of the active layer 13. In addition, the smaller the cross-sectional area of the trench 100 is, the thickness of the quantum well in the trench will increase accordingly, and the wavelength of light will increase accordingly due to the quantum Stark effect. Conversely, the greater the area of the cross-section of the trench 100, the less the difference between the doping rate of In element and the doping rate of Ga element, i.e., the less efficient the doping of In element and the lower the ratio of In element component in the grown active layer 13.

In some embodiments, Al element is doped in the base material GaN of the active layer 13, the smaller the area of the cross-section of the trench 100, the faster the growth rate of the base material GaN of the active layer 13, the worse the growth selectivity of Al element, and the smaller the doping rate of Al element is than the doping rate of Ga element, therefore, the smaller the area of the cross-section of the trench 100, the lower the component content of Al element in AlGaN, and thus the smaller the doping amount of Al, the longer the wavelength of the light emitted from the active layer 13.

Thus, through the trenches with different cross-sectional areas, the active layers 13 grown inside the trenches emit lights with different colors, thereby realizing various light emissions. Thus, when the semiconductor structure is configured as a light-emitting device, white light or full-color light can be realized.

Figure 17:
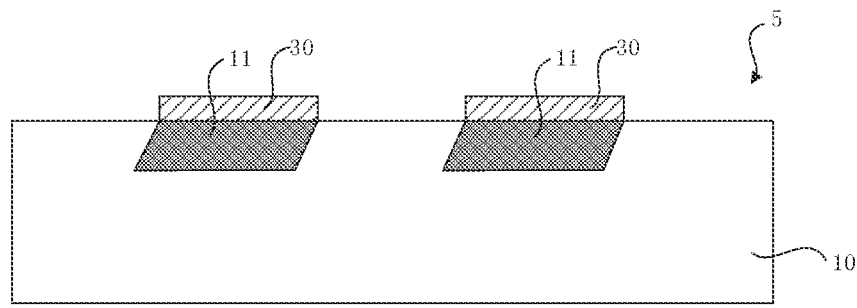
FIG. 17 is a schematic diagram of a semiconductor structure according to an embodiment of the present disclosure.
Figure 18:
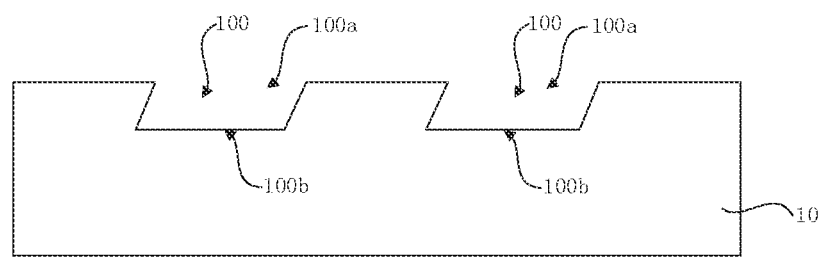
FIG. 18 is a schematic structure diagram of a base according to an embodiment of the present disclosure.

In some embodiments, FIG. 17 is a schematic diagram of a semiconductor structure according to an embodiment of the present disclosure, and FIG. 18 is a schematic structure diagram of a base according to an embodiment of the present disclosure, as shown in FIG. 17 and FIG. 18, the trench 100 includes an open end 100a and a bottom wall 100b opposite to each other in the thickness direction of the base 10; the orthographic projection of the opening end 100a on the plane in which the base 10 is located and the orthographic projection of the bottom wall 100b on the plane in which the base 10 is located are at least partially staggered.

It should be noted that "at least partially staggered" can mean that the orthographic projection of the center of the opening end 100a on the plane in which the base 10 is located and the orthographic projection of the center of the bottom wall 100b on the plane in which the base 10 is located do not coincide. Optionally, the area of the open end 100a and the area of the bottom wall 100b are not the same. Optionally, the side walls of the trench 100 are formed by the base 10, the side walls may be curved or linear as shown in FIG. 18, and the trench 100 is an oblique columnar trench. Optionally, to improve the light refraction rate, the area of the open end 100a is greater than the area of the bottom wall 100b, and the open end 100a completely covers the bottom wall 100b.

Optionally, as shown in FIG. 18, the side walls of the oblique columnar trench are parallel, which can be realized by controlling the type and flow rate of etching gas or controlling the direction of plasma during dry etching. In addition, the oblique columnar trench can also enable the light to emit from a specific angle formed by the trench 100, and the semiconductor structures can be configured to emit light at a fixed angle.

Figure 19:
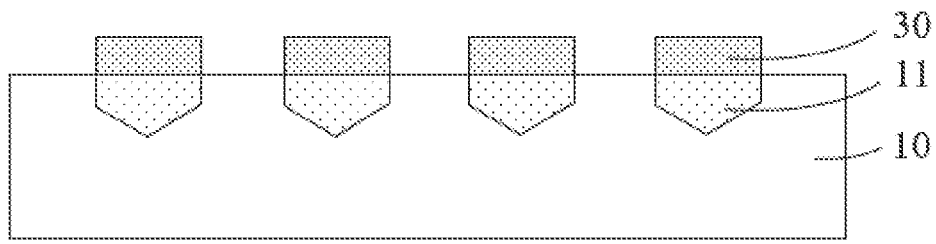
FIG. 19 is a schematic diagram of a semiconductor structure according to an embodiment of the present disclosure.
Figure 20:
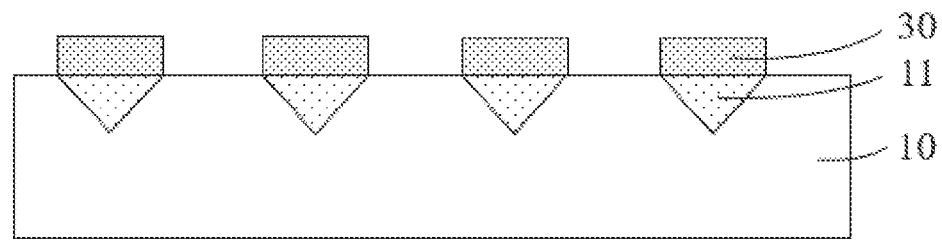
FIG. 20 is a schematic diagram of a semiconductor structure according to an embodiment of the present disclosure.

In some embodiments, FIG. 19 is a schematic diagram of a semiconductor structure according to an embodiment of the present disclosure, and FIG. 20 is a schematic diagram of a semiconductor structure according to an embodiment of the present disclosure. As shown in FIG. 19 and FIG. 20, cross-section of the monocrystalline layer 11 perpendicular to the plane in which the base 10 is located is pentagonal or triangular, that is, a surface of the monocrystalline layer 11 away from the epitaxial structure layer 30 is not parallel to the plane in which the base 10 is located. In FIG. 19, taking the cross section of the monocrystalline layer 11 as a hexagon as an example, the perspective view of the monocrystalline layer 11 can be composed of hexagonal prism and hexagonal pyramid; in FIG. 20, taking the cross section of monocrystalline layer 11 as a hexagon as an example, the perspective view of monocrystalline layer 11 is a hexagonal pyramid.

Figure 21:
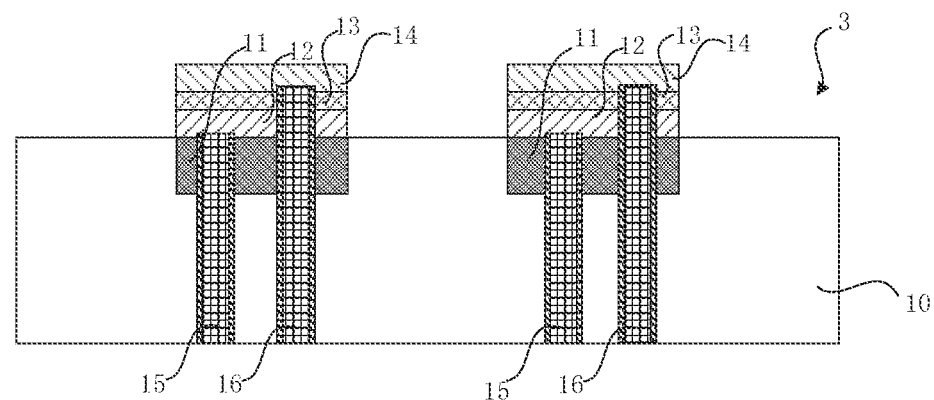
FIG. 21 is a schematic diagram of a semiconductor structure according to an embodiment of the present disclosure.

In some embodiments, FIG. 21 is a schematic diagram of a semiconductor structure according to an embodiment of the present disclosure, as shown in FIG. 21, the epitaxial structure layer 30 further includes: a first semiconductor layer 12, an active layer 13 and a second semiconductor layer 14 that are stacked, the active layer 13 is located on a side of the first semiconductor layer 12 away from the base 10; a conductivity type of the second semiconductor layer 14 is opposite to a conductivity type of the first semiconductor layer 12; and the semiconductor structure further includes: a first electrode 15 penetrating through the monocrystalline layer 11, the first electrode 15 is electrically connected to the first semiconductor layer 12; a second electrode 16 penetrates through the active layer 13, the first semiconductor layer 12 and the monocrystalline layer 11, and the second electrode 16 is electrically connected to the second semiconductor layer 14.

Optionally, when the thickness of the monocrystalline layer 11 is small enough, the epitaxial structure layer 30 can realize light emission in two directions from the top and the bottom of the base 10, and finally realize double-sided display.

The active layer 13 can be at least one of a single quantum well structure, a multiple quantum well (MQW) structure, a quantum line structure or a quantum dot structure. The conductivity type of this first semiconductor layer 12 is different from the conductivity type of the second semiconductor layer 14. The first semiconductor layer 12 may be a P-type semiconductor layer and the second semiconductor layer 14 may be an N-type semiconductor layer. Alternatively, the first semiconductor layer 12 may be an N-type semiconductor layer and the second semiconductor layer 14 may be a P-type semiconductor layer. The N-type semiconductor layer and/or the P-type semiconductor layer may include a group III nitride material. The group III nitride material may include at least one of GaN, AlGaN, InGaN or AlInGaN. The N-type doping ions in the N-type semiconductor layer can include at least one of Si ions, Ge ions, Sn ions, Se ions or Te ions. The P-type doping ions in the P-type semiconductor layer may include at least one of Mg ions, Zn ions, Ca ions, Sr ions or Ba ions.

The process for forming the first semiconductor layer 12, the active layer 13, and the second semiconductor layer 14 may include: atomic layer deposition, chemical vapor deposition, molecular beam epitaxial growth, plasma enhanced chemical vapor deposition, low pressure chemical evaporation deposition, metal organic compound chemical vapor deposition or a combination thereof.

In some embodiments, before the epitaxial growth of the first semiconductor layer 12, a nucleation layer and a buffer layer may be grown sequentially on the side of the monocrystalline layer 11 away from the base 10. A material of the nucleation layer can include, for example, AN, AlGaN, etc., and a material of the buffer layer can include at least one of AN, GaN, AlGaN or AlInGaN. The formation method of the buffer layer can be the same as the formation method of the first semiconductor layer 12. The nucleation layer can provide a nucleation center for the epitaxial semiconductor layer, which can alleviate the lattice mismatch between the monocrystalline layer and the epitaxial semiconductor layer, and reduce the influence from impurities of the monocrystalline layer on the growth of the semiconductor layer. The buffer layer can alleviate the stress between the monocrystalline layer and the epitaxially grown semiconductor layer due to lattice mismatch and thermal mismatch, and enhance the crystal quality.

Optionally, taking the first semiconductor layer 12 as an N-type semiconductor layer and the second semiconductor layer 14 as a P-type semiconductor layer as an example, the first electrode 15 is an N-type electrode, and the second electrode 16 is a P-type electrode. A material of the first electrode 15 and a material of the second electrode 16 can include at least one of gold, silver, aluminum, chromium, nickel, platinum or titanium. A voltage difference is applied between the first semiconductor layer 12 and the second semiconductor layer 14 by the first electrode 15 and the second electrode 16, thereby enabling the active layer 13 to emit light. Optionally, the first electrode 15 and the second electrode 16 further penetrate the base 10.

Figure 22:
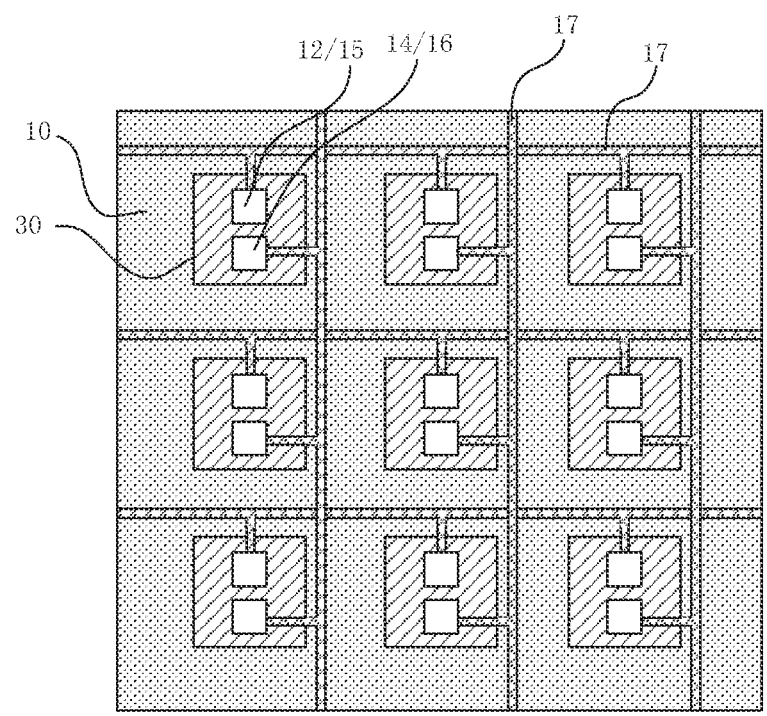
FIG. 22 is a schematic structure diagram of a drive circuit according to an embodiment of the present disclosure.

In some embodiments, FIG. 22 is a schematic structure diagram of a drive circuit according to an embodiment of the present disclosure, as shown in FIG. 22, the semiconductor structure further includes: a drive circuit 17, located on a side of the monocrystalline layer 11 away from the first semiconductor layer 12, and the drive circuit is electrically connected to the first electrode 15 or the second electrode 16; and the orthographic projection of the drive circuit 17 on the plane in which the base 110 is located is offset from the orthographic projection of the at least one trench on the plane in which the base 110 is located.

Specifically, the drive circuit 17 is provided on a side of the base 10 away from the first semiconductor layer 12, and the drive circuit 17 is respectively electrically connected to the first electrode 15 and the second electrode 16, and the orthographic projection of the drive circuit 17 on the plane where the base 10 is located is staggered from the orthographic projection of the at least one trench 100 on the plane where the base 10 is located, so as to prevent the drive circuit from blocking light and affecting the visual effect, and to realize a double-sided display. Optionally, the driving circuit 17 is manufactured on the base 10, and on the back side of the base 10 away from the first semiconductor layer 12. It should be noted that the drive circuits 17 electrically connected to the first electrode 15 and the second electrode 16 respectively should be insulated from each other to avoid signal short circuit.

The present application discloses a semiconductor structure including: a base, the base being made of an amorphous material and including at least one trench; a monocrystalline layer, at least part of the monocrystalline layer being provided in the at least one trench; and an epitaxial structure layer, located on the side of the monocrystalline layer away from the base. The semiconductor structure disclosed in the present application includes the monocrystalline layer formed in the at least one trench of the base, and an amorphous material with a thermal expansion coefficient similar to that of the monocrystalline layer is selected as the base, which can relieve the tensile stress generated by the monocrystalline layer during the epitaxial process. At the same time, the amorphous material has the advantages of low cost and simple process; the epitaxial structure layer is grown on an independent monocrystalline layer, and the size is small, which alleviates the problem of semiconductor film cracking on the large-size substrate.

It should be noted that, while this specification contains many specific embodiments, these embodiments should not be understood as limiting the scope of any invention or what may be claimed, but are used to describe features of specific embodiments of particular inventions. Certain features described in a single embodiment in this specification may also be implemented in combination in other embodiments. In some cases, the features recited in the claims can be performed in a different order and still achieve the desirable result. In addition, the order of the features depicted in the accompanying drawings is not necessary in a particular order or sequential order to achieve the desirable results. In some implementations, it may also be multitasking and parallel processing. The foregoing are only some embodiments of the present disclosure and are not intended to limit the present disclosure, and any modifications, equivalent substitutions, improvements, etc., made within the spirit and principles of the present disclosure shall be included within the scope of protection of the present disclosure.

What is claimed is:

1. A semiconductor structure, comprising:
   a base, wherein the base comprises an amorphous material, and the base comprises at least one trench;
   a monocrystalline layer, wherein at least part of the monocrystalline layer is in the at least one trench; and
   an epitaxial structure layer, located on a side of the monocrystalline layer away from the base.

2. The semiconductor structure according to claim 1, wherein a cross-section of the at least one trench comprises rectangular, triangular or hexagonal, and the cross-section is along a plane parallel to a plane in which the base is located.

3. The semiconductor structure according to claim 1, wherein in a wavelength range from 360 nm to 800 nm, a light transmittance of at least one wavelength of light passing through the base is greater than 70%.

4. The semiconductor structure according to claim 3, wherein a material of the base comprises glass or organic polymer material.

5. The semiconductor structure according to claim 1, wherein the monocrystalline layer comprises monocrystalline Si or monocrystalline Ge.

6. The semiconductor structure according to claim 5, wherein a crystal face of the monocrystalline layer away from the base comprises a (111) crystal face.

7. The semiconductor structure according to claim 5, wherein the monocrystalline layer comprises monocrystalline Si, and a thickness of the monocrystalline layer is less than or equal to 1 μm.

8. The semiconductor structure according to claim 5, wherein the monocrystalline layer comprises monocrystalline Si, and the epitaxial structure layer comprises a GaN-based material.

9. The semiconductor structure according to claim 5, wherein the monocrystalline layer comprises monocrystalline Ge, and the epitaxial structure layer comprises a GaAs layer.

10. The semiconductor structure according to claim 9, wherein the epitaxial structure layer further comprises an AlInGaP layer located on a side of the GaAs layer away from the monocrystalline layer.

11. The semiconductor structure according to claim 1, wherein the at least one trench comprises a plurality of trenches, and the plurality of the trenches are arranged in an array or in a staggered arrangement.

12. The semiconductor structure according to claim 1, wherein a part of the monocrystalline layer protrudes from the at least one trench.

13. The semiconductor structure according to claim 1, wherein the at least one trench comprises a plurality of groups, each group comprises multiple trenches, an area of a cross-section of at least one of the trenches in a group is different from areas of cross-sections of the other trenches in the group, and the cross-section is along a plane parallel to a plane in which the base is located.

14. The semiconductor structure according to claim 1, wherein one of the at least one trench comprises an open end and a bottom wall opposite to each other in a direction of a thickness of the base; and an orthographic projection of the open end on a plane in which the base is located and an orthographic projection of the bottom wall on a plane in which the base is located are at least partially staggered.

15. The semiconductor structure according to claim 1, wherein the epitaxial structure layer further comprises: a first semiconductor layer, an active layer and a second semiconductor layer that are sequentially stacked, wherein the active layer is on a side of the first semiconductor layer away from the base; and a conductivity type of the second semiconductor layer is opposite to a conductivity type of the first semiconductor layer; and wherein the semiconductor structure further comprises:

a first electrode, penetrating the monocrystalline layer, wherein the first electrode is electrically connected to the first semiconductor layer; and a second electrode, penetrating the active layer, the first semiconductor layer and the monocrystalline layer, wherein the second electrode is electrically connected to the second semiconductor layer.

16. The semiconductor structure according to claim 15, wherein the semiconductor structure further comprises:

a drive circuit, located on a side of the monocrystalline layer away from the first semiconductor layer, wherein the drive circuit is electrically connected to the first electrode or the second electrode; and an orthographic projection of the drive circuit on the plane in which the base is located is staggered from an orthographic projection of the at least one trench on the plane in which the base is located.

17. The semiconductor structure according to claim 15, wherein the first semiconductor layer is an N-type semiconductor layer and the second semiconductor layer is a P-type semiconductor layer.

* * * * *